(12) United States Patent
Cheng et al.

(10) Patent No.: US 6,282,694 B1
(45) Date of Patent: Aug. 28, 2001

(54) IC DESIGN FLOORPLAN GENERATION USING CEILING AND FLOOR CONTOURS ON AN O-TREE STRUCTURE

(76) Inventors: Chung-Kuan Cheng, 4407 Mensha Pl., San Diego, CA (US) 92130; Pei-Ning Guo, 765 Erie Cir., Milpitas, CA (US) 95035

( * ) Notice: Subject to any disclaimer, the term of this patent is extended or adjusted under 35 U.S.C. 154(b) by 0 days.

(21) Appl. No.: 09/336,529

(22) Filed: Jun. 18, 1999

(51) Int. Cl.[7] .................................................. G06F 17/50
(52) U.S. Cl. .................................. 716/10; 716/2; 716/7; 716/12
(58) Field of Search ........................................... 716/1–21

(56) References Cited

U.S. PATENT DOCUMENTS

| | | | |
|---|---|---|---|
| 4,554,625 | * 11/1985 | Otten | 700/171 |
| 5,657,239 | * 8/1997 | Grodstein et al. | 716/6 |
| 5,748,486 | * 5/1998 | Ashar et al. | 716/18 |
| 5,818,729 | * 10/1998 | Wang et al. | 716/9 |
| 6,009,250 | * 10/1998 | Ho et al. | 716/5 |
| 6,086,626 | * 7/2000 | Jain et al. | 716/5 |

OTHER PUBLICATIONS

Cai et al., "Conflict–free channel definition in building–block layout", IEEE Transactions on Computer–Aided Design of Integrated Circuits and Systems, vol. 8, No. 9, pp. 981–988. Sep. 1989.*

Herrigel, "GRCA: a global approach for floorplanning synthesis in VLSI macrocell design", 1990 IEEE International Conference on Computer–Aided Design, Nov. 1990, ICCAD–90, pp. 152–155, Nov. 1990.*

Song et al., "A new model for general connectivity and its application to placement", proceedings of Sixth Great Lakes Symposium on VLSI, Mar. 1996, pp. 60–63.*

Cai, "On Empty Rooms in Floorplan Graphs: Comments on a deficiency in Two Papers", IEEE Transactions on Computer–Aided Design, vol. 8, No. 7, pp. 795–797, Jul. 1989.*

Xu et al. ("Cluster refinement for block placement", Proceedings of the 34th Annual ACM IEEE Design Automation Conference, pp. 762–765), Jun. 1997.

* cited by examiner

Primary Examiner—Matthew Smith
Assistant Examiner—Phallaka Kik
(74) Attorney, Agent, or Firm—Columbia IP Law Group, PC

(57) ABSTRACT

An EDA tool is provided with a floorplan generator to automatically generate an optimized floorplan for an IC design having a number of design blocks. The floorplanner generates an initial O-tree representation for the design blocks. The floorplanner then perturbs the O-tree representation to seek an alternate O-tree representation that represents an optimized placement of the design blocks in accordance with a cost function. The floorplanner performs the perturbation systematically for all design blocks, traversing the O-tree representation in a depth-first manner and removing one design block at a time. In one embodiment, for each removed design block, the floorplanner also seeks an appropriate re-insertion point for the removed design block systematically by traversing a reduced version of the O-tree representation augmented with candidate insertion points in a depth-first manner. Under the present invention, ceiling and floor contours as well as contour pointers are employed to improve the efficiency of the traversing iterations.

19 Claims, 11 Drawing Sheets

(00110100011011, adbcegf)
1012

INSERTING POSITION

IC DESIGN FLOORPLAN GENERATION USING CEILING AND FLOOR CONTOURS ON AN O-TREE STRUCTURE

BACKGROUND OF THE INVENTION

1. Field of the Invention

The present invention relates to the field of integrated circuit (IC) design. More specifically, the present invention relates to an improved method for generating optimized floorplans for design blocks, using ceiling and floor contours on an O-tree structure.

2. Background Information

As the complexity of IC design continues to increase, pre-existing design hierarchies or design blocks are increasingly being "re-used" to simplify the design task. Floorplanning or building block placement is becoming critical to the performance of the hierarchical design process.

In the case of floorplan with slicing structure, it is known to use a binary tree representation to perform the building block placement operation. The leaves of the binary tree correspond to the blocks and each internal node defines a vertical or horizontal merge operation of its two descendents. The number of possible configurations for the tree, and therefore the extent of computation is in the order of $O(n!2^{5n-3}/n^{1.5})$. There have been efforts to identify the redundancy among the possible configurations, and thereby reducing the amount of computation. See e.g. D. F. Wong, and C. L. Lin, *A New Algorithm for Floorplan Design*, DAC, pp. 101–107, 1986.

Efforts have also been made to extend the binary tree representation to floorplan with non-slicing structure. See e.g. P. Pan and C. L. Liu, *Area Minimization for Floorplans*, IEEE Transactions on Computer-Aided Design of Integrated Circuits and System, pp. 123–132, January, 1995; and T. C. Wang, and D. F. Wong, *An Optimal Algorithm for Floorplan Area Optimization*, DAC, pp. 180–186, 1990. However, the performance of these approaches have been less desirable.

Onodera et al. further classify topological relationship between two blocks in a floorplan with non-slicing structure into four classes, and use branch-and-bound method to solve the problem. See H. Onodera, Y. Taniguchi, K. Tamaru, *Branch-and-Bound Placement for Building Block Layout*, DAC, pp. 433–439, 1991. The disadvantage of the approach is that the solution space is still in the order of $O(2^{n(n+2)})$, which is too complicated even for today's high performance computers.

Sequence pair and bounded slicing grid have been introduced the reduce the solution space for the floorplan with non-slicing structure problem. See e.g. H. Murata, K. Fujiyoshi, S. Nakatake, and Y. Kajatani, *Rectangular-Packing-Based Module Placement*, ICCAD, pp. 472–479, 1995; and S. Nakatake, K. Fujiyoshi, H. Murata, and Y. Kajatani, *Module Placement on BSG-Structure and IC Layout Application*, ICCAD, pp. 484–491, 1996. The two approaches are different representations, but they are all basically based on constraint graph to manipulate the transformation between the representation and their placement, which unfortunately also requires intensive amount of computation. When using the sequence pair representation, two sets of permutations are employed to present the geometric relations of the blocks. The possible configurations are in the order of $O((n!)^2)$. From sequence pair to its placement, the transformation operation takes $O(n \log n)$ time. See e.g. T. Takahasi, *An Algorithm for Finding a Maximum-Weight Decreasing in a Permutation, Motivated by Rectangle Packing Problem*, IEICE, vol. VLD96, pp. 31–35, 1996. When using the bounded slicing grid approach, an n by n grid plane is used for placement of n blocks. The representation itself has much dependency, one floorplan could have several choices of representations, resulting inefficient and wasteful computation.

An iterative approach employing cluster refinement has also been proposed to optimize area and interconnection. See e.g. J. Xu, P.N. Guo, and C.K. Cheng, *Cluster Refinement for Block Placement*, DAC, pp. 762–765, 1997. For small cluster sizes (k), the run time complexity for each iteration is in the order of $O(n^{2+k/2})$. However, for larger cluster sizes, the approach is too CPU-intensive and difficult to handle.

Finally, most recently, Guo and Cheng have devised an ordered tree (O-tree) structure to represent placement of design blocks. A deterministic approach was developed to search for an O-tree representation that corresponds to an optimal placement. Under te deterministic approach, design blocks and candidate "reinsertion" points are systematically analyzed with respect to a cost function to find the optimal placement. Experience has shown the deterministic approach to be still too time consuming.

Thus, an improved approach to design block placement and floorplan generation is desired.

Note: The concept of O-tree and the deterministic approach to seeking the optimal placement will be the subject of a presentation in the upcoming Design Automation Conference, Jun. 21–25, 1999, accordingly published as part of the Proceedings of the conference in a future day. The concept of O-tree and the deterministic approach is thus also explained as foundational materials in the description of the improved approach of the present invention to follow.

SUMMARY OF THE INVENTION

An EDA tool is provided with a floorplan generator to automatically generate an optimized floorplan for an IC design having a number of design blocks. The floorplanner generates an initial O-tree representation for the design blocks. The floorplanner then perturbs the O-tree representation to seek an alternate O-tree representation that represents an optimized placement of the design blocks in accordance with a cost function. The floorplanner performs the perturbation systematically for all design blocks, traversing the O-tree representation in a depth-first manner and removing one design block at a time. For each removed design block, the floorplanner also seeks an appropriate re-insertion point for the removed design block systematically, by traversing a reduced version of the O-tree representation augmented with candidate insertion points in a depth-first manner. Under the present invention, ceiling and floor contours as well as contour pointers are employed to improve the efficiency of the traversing iterations.

BRIEF DESCRIPTION OF DRAWINGS

The present invention will be described by way of exemplary embodiments, but not limitations, illustrated in the accompanying drawings in which like references denote similar elements, and in which:

FIG. 12 illustrates the concept of current contour employed by the constraint graph generator of FIG. 1a.

DETAILED DESCRIPTION OF THE INVENTION

In the following description, various aspects of the present invention will be described, and various details will be set forth in order to provide a thorough understanding of the present invention. However, it will be apparent to those skilled in the art that the present invention may be practiced with only some or all aspects of the present invention, and the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as design blocks, multi-bit encoding, constraint graphs, and so forth. Also, parts of the description will also be presented in terms of operations performed by a computer system, using terms such as traversing, generating, determining, and the like. As well understood by those skilled in the art, these quantities or operations take the form of electrical, magnetic, or optical signals being stored, transferred, combined, and otherwise manipulated through electrical, magnetic and optical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Figure 1A:
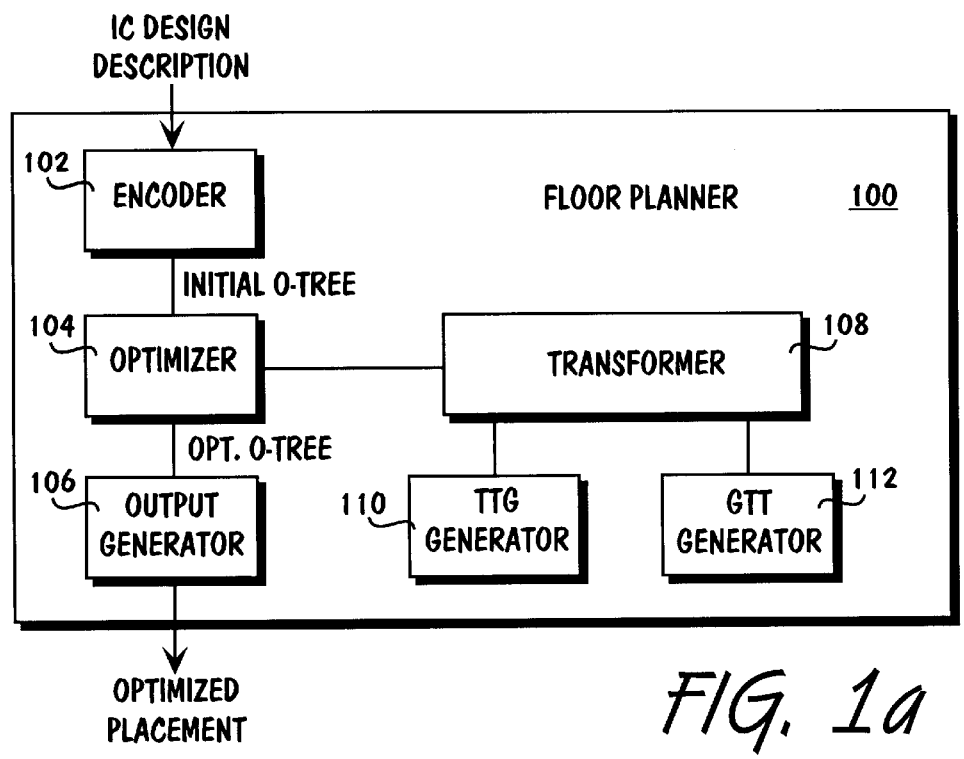
FIGS. 1a–1b illustrate an overview of the present invention in accordance with a first and a second embodiment.
Figure 1B:
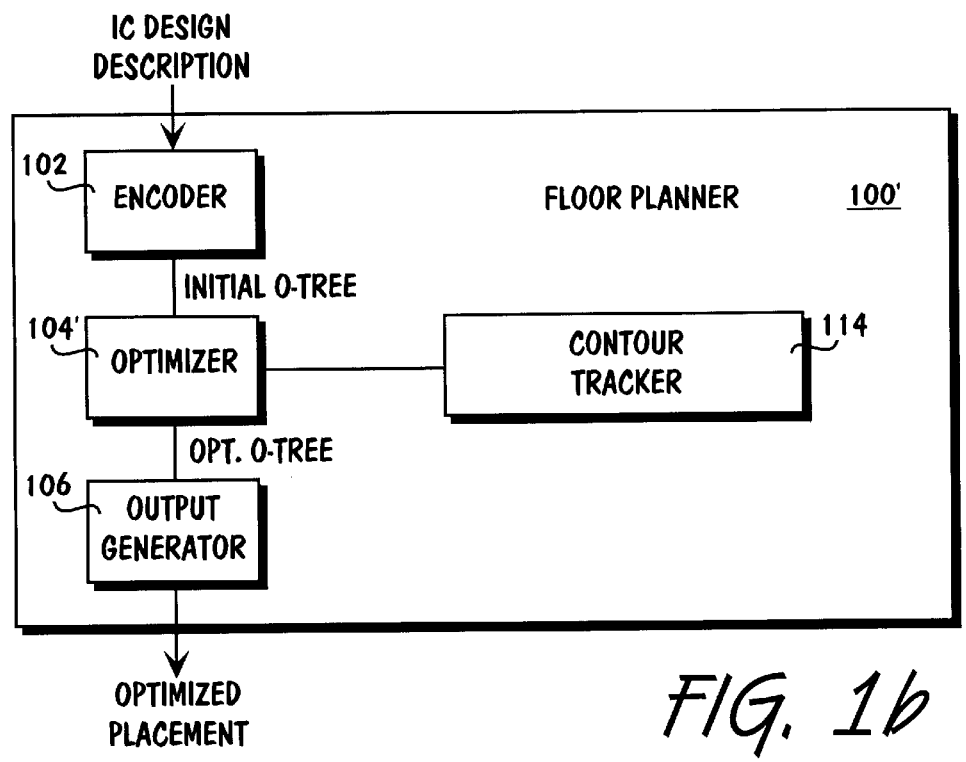

Referring now to FIGS. 1a–1b, wherein two block diagrams illustrating an overview of the present invention in accordance with a first and a second embodiment is shown. As illustrated, in accordance with the present invention, a floor planning module (or floorplanner) 100 is constituted with encoder 102, optimizer 104 and output generator 106, operatively coupled to each other as shown. Briefly, encoder 102 receives a description of an IC design having a number of design blocks (e.g. reusable design blocks) as inputs, and generates an initial ordered tree (or O-tree) representation for the design blocks, representing an initial placement permutation of the design blocks. Optimizer 104, iteratively working with the O-tree representation, modifying and re-modifying the O-tree representation as necessary, to generate an optimized placement (i.e. floorplan) for the design blocks in accordance with a cost function. Output generator 106 then outputs the floorplan, in accordance with the final O-tree representation or optimized placement permutation of the design blocks.

For the embodiment of FIG. 1a, when iteratively working with the O-tree representation, modifying and re-modifying the O-tree representation as necessary, to generate the optimized floorplan for the design blocks in accordance with the cost function, optimizer 104 is assisted by transformer 108. Transformer 108 is in turn assisted by tree-to-graph (TTG) generator 110 and graph-to-tree (GTT) generator 112. Briefly, optimizer 104 removes design blocks from the O-tree representation, one at a time, and for each removed design block, optimizer 104 considers various candidate insertion points to re-insert the removed design block, one candidate insertion point at a time. When considering each insertion point, optimizer 104 invokes transformer 108 to generate an admissible version of the O-tree representation with the design block re-inserted at the candidate insertion point. Transformer 108 in turn iteratively invokes TTG generator 110 and GTT generator 112 to generate an orthogonal constraint graph for a particular O-tree representation, and re-generate an O-tree representation in view of a generated constraint graph respectively.

For the embodiment of FIG. 1b, when iteratively working with the O-tree representation, modifying and re-modifying the O-tree representation as necessary, to generate the optimized floorplan for the design blocks in accordance with the cost function, optimizer 104' is assisted by contour tracker 114. In this embodiment, optimizer 104' employs a more streamlined approach in determining whether for each removed design block, there is a re-insertion point to re-insert the removed design block that will yield improvement the cost function. Optimizer 104' integrally performs the insertion point consideration and placement generation, employing a ceiling contour and a floor contour. Optimizer 104' invokes contour tracker 114 to create and maintain the contour pairs and their related pointers.

These and other aspects of the present invention will all be described more fully below.

Skipping now to FIGS. 10a–10d, wherein four diagrams illustrating one placement permutation of an example IC design with seven design blocks, the concept of O-tree representation and its encoding in accordance with the present invention are shown. Illustrated therein is one placement permutation of an example IC design having seven design blocks 1002a–1002f. For the illustrated embodiment, for simplicity and ease of operation, each design block 1002* (* being one of a through f) is "rounded" to be rectangular in shape having height ($h_i$) and width ($w_i$). Thus, a placement permutation may be represented as P={($x_i$, $y_i$), 1<=i <=n}, where n is the number of design blocks and ($x_i$, $y_i$) is assignment of x, y coordinates to an anchor vertex (e.g. the lower left corner vertex) and design block i, referencing a coordinate system (e.g. one with the origin (0, 0) located at the lower left corner). In alternate embodiments, other design block shapes as well as other coordinate systems and placement representations may be employed.

An O-tree representation 1004a or 1004b is formed by employing a node 1006 to represent each design block, and an artificial root node 1008a or 1008b to represent a reference edge 1010a or 1010b. For the illustrated embodiment, the reference edge is either the left edge 1010a or the bottom edge 10b. In alternate embodiments, other reference edges, e.g. the right edge or the top edge may be employed instead. In the former case, i.e. when left edge 1010a is used as the reference edge, O-tree representation 1004a is said to be an horizontal O-tree representation, whereas in the latter case, i.e. when bottom edge 1010b is used as the reference edge, O-tree representation 1004b is said to be a vertical O-tree representation. In an horizontal O-tree representation 1004a, two nodes 1006 are linked together if the two corresponding design blocks (e.g. a and d) are at least partially abut each other horizontally. In like manner, in a vertical O-tree representation 1004b, two nodes 1006 are linked together if the two corresponding design blocks (e.g. a and b) are at least partially abut each other vertically.

A compact multi-bit encoding 1012 is employed to encode an O-tree representation, whether it is horizontal or vertical. Multi-bit encoding 1012 is formed by bit values representing the corresponding movement directions if the O-tree is traversed in a depth-first manner. For the illustrated embodiment, a leaf-bound movement direction is represented by a bit-value of "0", and a root-bound movement direction is represented by a bit-value of "1". Thus, the example horizontal O-tree representing the illustrated placement permutation of the example IC design with seven design blocks is represented as {00110100011011, abcdefg}. Thus, an O-tree representation of n+1 nodes for an IC design with n design blocks (excluding the node labels) may be compactly represented by 2n bits.

Still referring to FIGS. 10a–d, in the description to follow, a placement is said to be L-compact if no design block can be shifted left from its current position, with other design blocks fixed. In other words, a placement is L-compact when the placement is x-direction compacted to the left edge. Similarly, a placement is said to be B-compact if no design block can be shifted down from its current position, with other design blocks fixed. In other words, a placement is B-compact when the placement is y-direction compacted to the bottom edge. Therefore, a placement is said to be LB-compact if and only if the placement is both L-compact and B-compact. An LB-compact placement is said to be an admissible placement, and its O-tree representation is said to an admissible O-tree.

Figure 11:
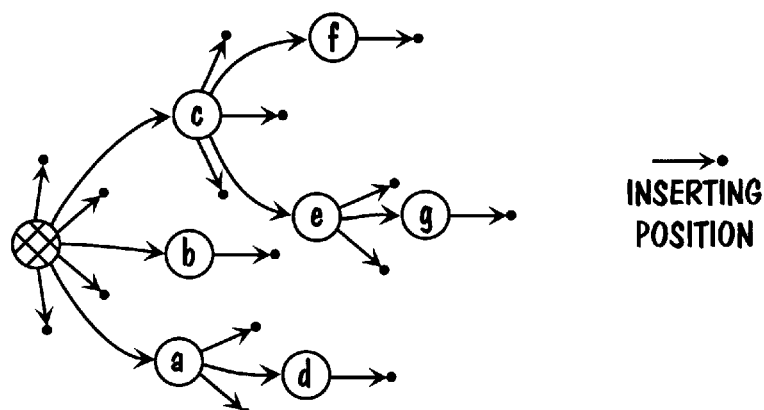
FIG. 11 illustrates the concept of insertion points.

In the description to follow, as alluded to earlier, references will be made to the concept of candidate insertion points for selecting an appropriate reinsertion point for a candidate design block removed from an O-tree representation. FIG. 11 illustrates the concept of candidate insertion points for the example IC design of FIG. 10.

When further describing the embodiment of FIG. 1a, references will also be made to the generation of an orthogonal constraint graph for an O-tree representation. The orthogonal constraint graph for an horizontal O-tree representation is a vertical constraint graph, whereas the orthogonal constraint graph for a vertical O-tree representation is a horizontal constraint graph. A constraint graph G is a set of nodes V and edges E, i.e. G=(V, E), where the nodes in V are the design blocks plus four nodes used for the boundaries of the placement, and the edges in E are the geometric constraints between two design blocks. A geometric constraint is said to exist if a horizontal/vertical line between the two blocks can be drawn without passing through other block. The edges in E are directed. There are two kind of edges: one with the direction from a left node to a right node, another with the direction from a bottom node to a top node. The weight d(e) for an edge e between two design blocks is the separation distance between the two design blocks. D(e) is equal to $x_j - x_i - w_i$ for an horizontal edge, and $y_j - y_i h_i$ for a vertical edge, where $(x_i, y_i)$ and $(x_j, y_j)$ are the coordinates of the placement reference point of the two design blocks. Thus, the weight d(e) is equal to zero when two design blocks are adjacent to each other, otherwise it is positive. Thus, V and the horizontal edges $E_h$ together made up the horizontal constraint graph, i.e. $G_h=(V, E_h)$, whereas V and the vertical edges $E_v$ together made up the vertical constraint graph, i.e. $G_v(V, E_v)$. Both $G_h$ and $G_v$ are s-t planar directed acyclic graphs, where s and t are the global source and sink of the graph respectively.

Figure 12:
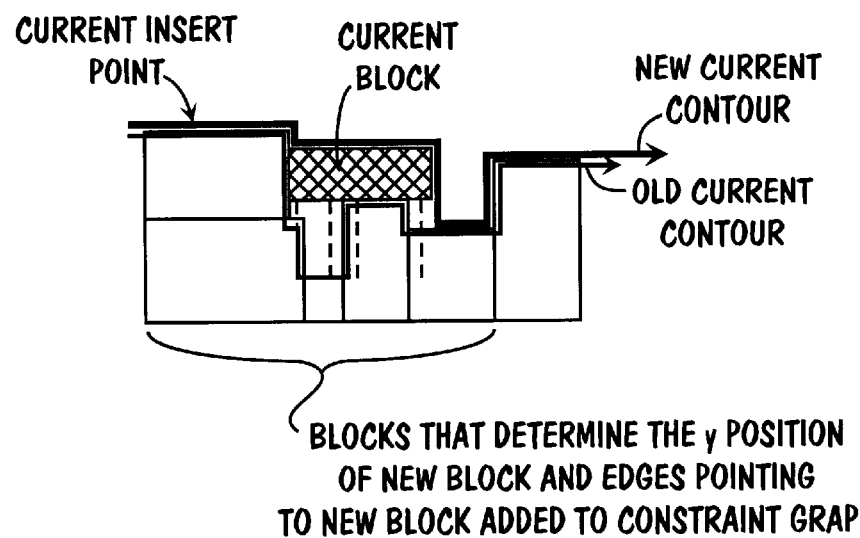

Furthermore, in the description of the generation of an orthogonal constraint graph, references will also be made to the concept of a current contour, which refers to the current profile of the top-edges of the reference (or placed) design blocks for a current candidate insertion point (see FIG. 12). The current contour is employed to assist in the generation of the orthogonal constraint graph for an O-tree representation with the removed design block having been re-inserted in the candidate insertion point.

Figure 13A:
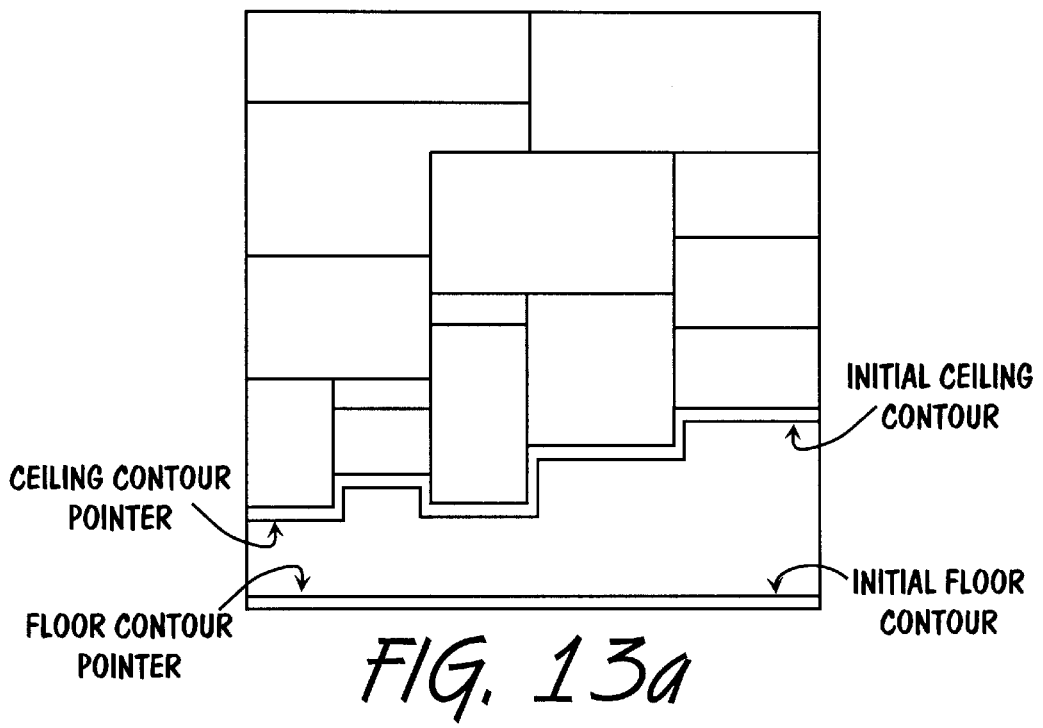
FIGS. 13a–13b illustrate the concept of ceiling and floor contours employed by the optimizer of FIG. 1b.
Figure 13B:
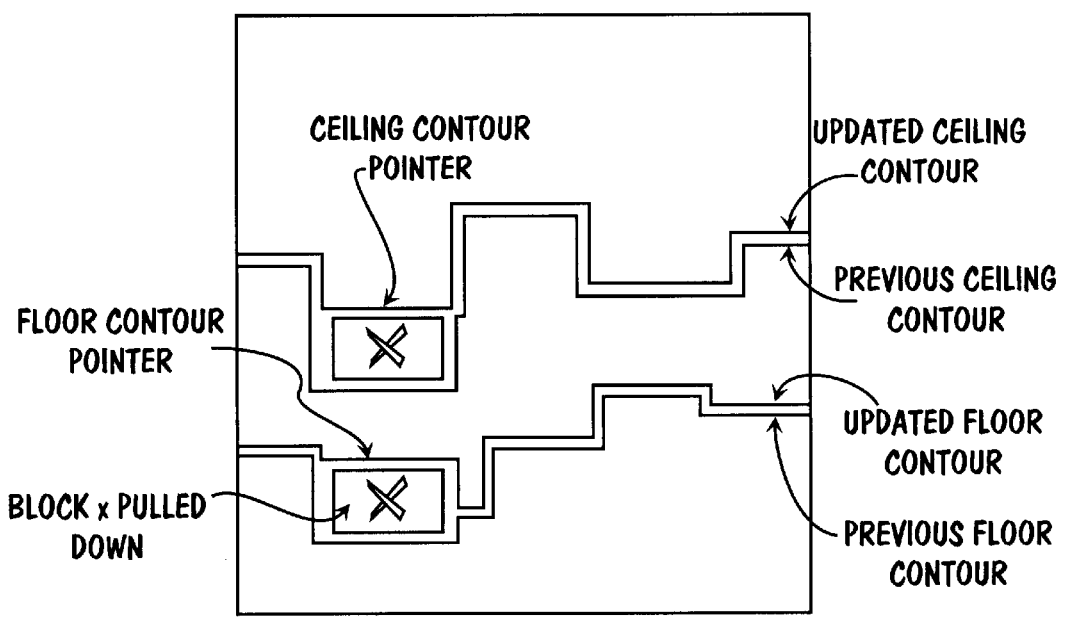

In the description of the embodiment of FIG. 1b, references will be made to the concept of a ceiling contour and the concept of a floor contours (see FIGS. 13a–13b). The ceiling contour refers to the current profile of the bottom edges of the design blocks pushed towards the top edge of an IC design, and the floor contour refers to the profile of the top edges of the design blocks moved towards the bottom edge of the IC design. Together the ceiling and floor contours form a contour pair to assist in the integral placement of design blocks while considering candidate insertion points, thereby leading to a more efficient identification of an optimized placement for the IC design.

Figure 2:
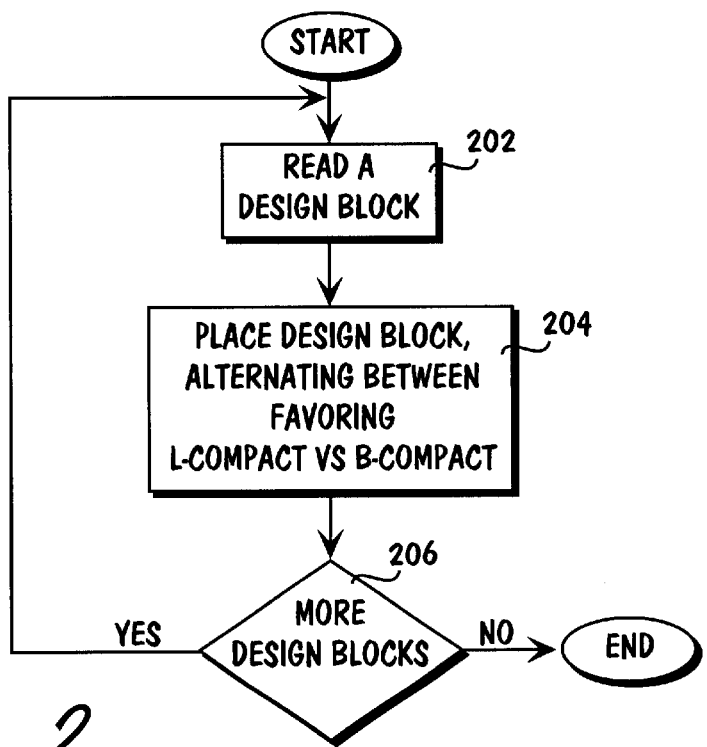
FIG. 2 illustrates the operation flow of the encoder of FIGS. 1a–1 b, in accordance with one embodiment.

Referring now FIG. 2, wherein a block diagram illustrating the operational flow of encoder 102 in accordance with one embodiment is shown. As described earlier, encoder 102 receives a description of the IC design as inputs, and in response, generates an initial O-tree representation representing an initial placement permutation of the design blocks. For the illustrated embodiment, the description of the design blocks are successively provided, and the description of each design block includes its height and width ($h_i$, $w_i$). Thus, at 202, encoder 102 reads the description of a design block. At 204, encoder 102 using the included ($h_i, w_i$) information, places the design block in the most LB-compact manner, alternating between favoring L-compact versus B-compact. That is, for odd numbered design blocks, encoder 102 places the design blocks in the most LB-compact manner, favoring L-compact over B-compact, and for even numbered design blocks, encoder 102 places the design blocks in the most LB-compact manner, favoring B-compact over L-compact. When favoring L-compact over B-compact, encoder 102 first find the most compact y-coordinate it can place the design block before finding the most compact x-coordinate it can place the design block. When favoring B-compact over L-compact, the reverse is done, encoder 102 first find the most compact x-coordinate it can place the design block before finding the most compact y-coordinate it can place the design block.

Operations 202 and 204 are repeated as many times as necessary to create the initial placement permutation, i.e. as long as there are design blocks to be placed, 206. Next, at 208, encoder 102 generates the multi-bit encoding for the O-tree representation of the initial placement permutation.

Figure 3:
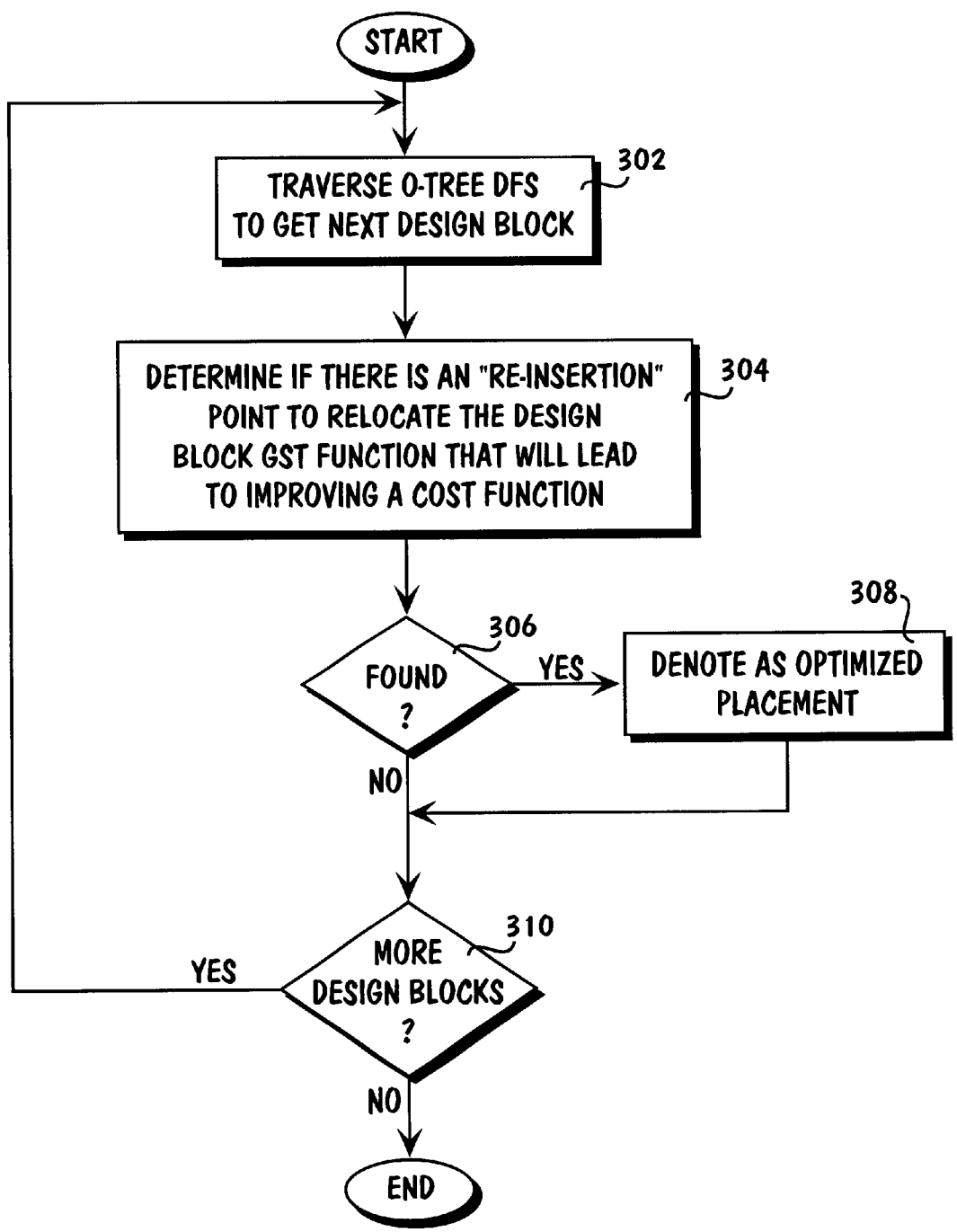
FIG. 3 illustrates the general operation flow of the optimizer of FIGS. 1a–1b, in accordance with one embodiment.

Referring now to FIG. 3, wherein a block diagram illustrating the general operation flow of optimizer 104 and 104' of FIGS. 1a–1b, in accordance with the embodiment is shown. As described earlier, optimizer 104 or 104', iteratively working with the O-tree representation, modifying and re-modifying the O-tree representation as necessary, to generate an optimized placement (i.e. floorplan) for the design blocks in accordance with a cost function. For the illustrated embodiment, the cost function considers the total area required to place the design blocks as well as interconnect cost. For this embodiment, the description of the IC design also includes the interconnectivity requirements of the design blocks. At 302, optimizer 104 or 104' traverses the O-tree representation in a depth-first manner to select the next design block to perform the analysis. Optimizer 104 or 104' removes the selected data block from the O-tree representation, creating a modified reduced version of the O-tree representation, without the removed design block.

At 304, optimizer 104 or 104' systematically attempts to determine if there is a re-insertion point to re-insert the removed data block back into the O-tree representation, such that the new O-tree representation represents an improved placement of the design blocks over the current placement, in accordance with the cost function. If such improved placement was found, 306, optimizer 104 or 104' denotes the placement as the optimized placement, 308. Whether such annotation was made, the process continues as 310, where optimizer 104 or 104' determines if it has performed the analysis for all design blocks. If more design blocks are to be analyzed, optimizer 104 or 104' continues the process at 302, otherwise the process is terminated.

Figure 4A:
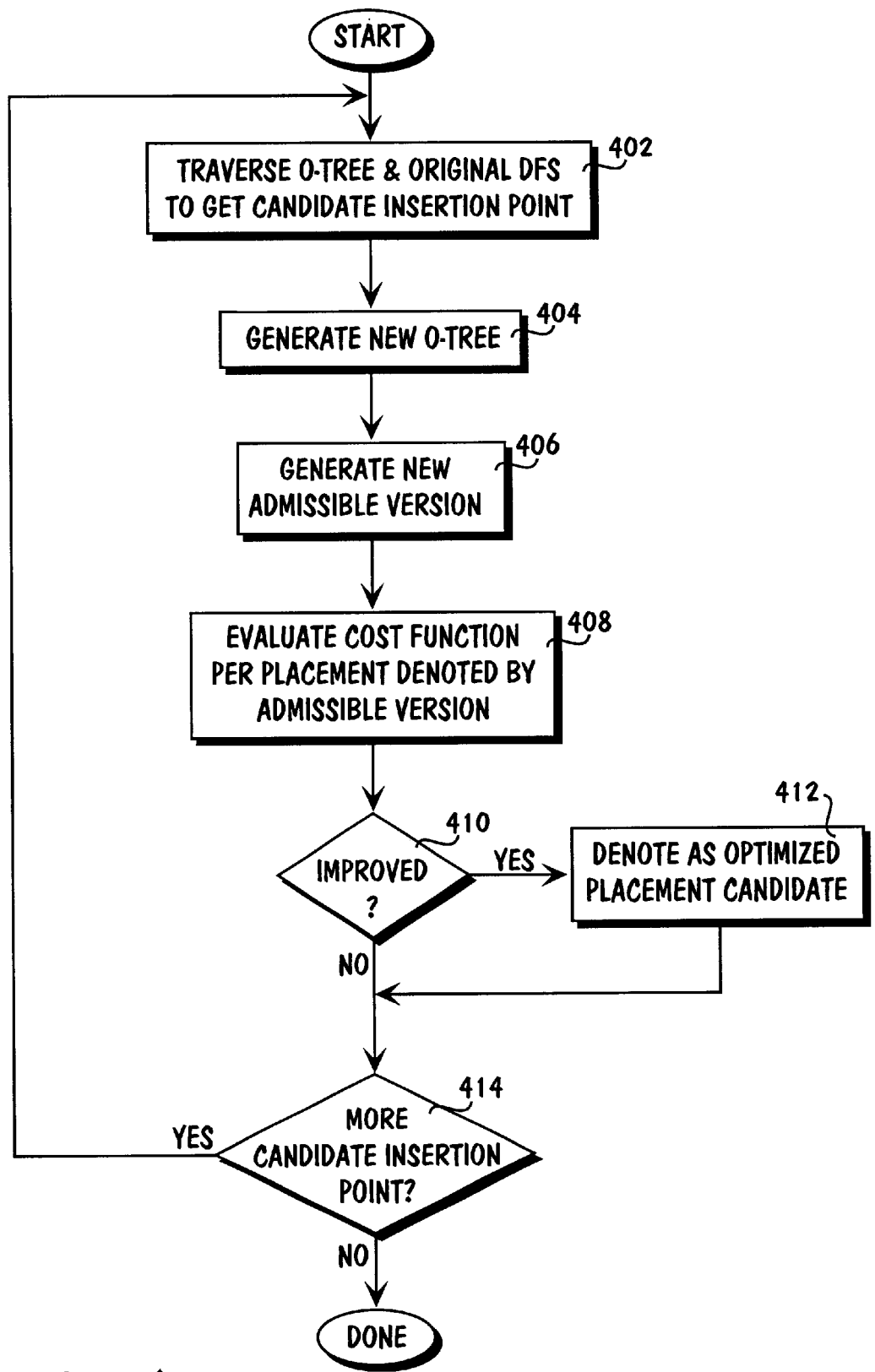
FIGS. 4a–4b illustrate the determining operation of FIG. 3, in accordance with one embodiment each for the optimizer of FIGS. 1a–1b respectively.

Referring now to FIG. 4a, where a block diagram illustrating operation 304 of FIG. 3 for the embodiment of FIG. 1a in further detail is shown. As shown, at 402, optimizer 104 traverses in a depth-first manner, the reduced version of the O-tree representation and the reduced version's orthogonal version, to select the next candidate insertion point to consider. At 404, optimizer 104 re-inserts the removed data block in the selected candidate insertion point to generate the new O-tree representation. At 406, optimizer 104 invokes transformer 108 to generate the admissible version of the new O-tree representation for the given insertion operation.

At 408, optimizer 104 evaluates the cost function in view of the generated admissible version. At 410, optimizer 104 examines the cost computation results to determine if the new O-tree representation represents an improved placement permutation. If the new O-tree representation represents an improved placement permutation 410, the O-tree representation is so denoted and saved 412. Otherwise, the process continues at 414.

At 414, optimizer 104 determines if it has considered all candidate insertion points for the removed design block. If more candidate insertion points are to be considered, optimizer 104 continues the process at 402, otherwise the operation terminates.

Figure 5:
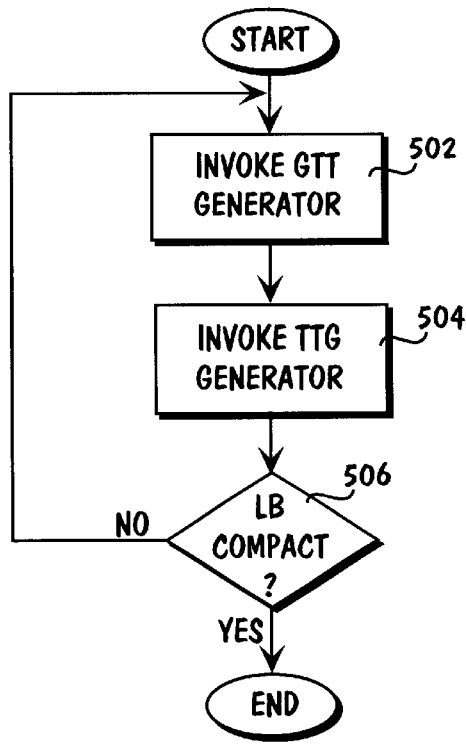
FIGS. 5 and 6a–6b illustrate the operation flow of the transformer, the constraint graph generator, and the tree generator of FIG. 1a, in accordance with one embodiment each.

Skipping now to FIG. 5, wherein a block diagram illustrating the operation flow of transformer 108 of FIG. 1a in accordance with one embodiment is shown. As described earlier, transformer 108 is used to generate an admissible version of an O-tree representation. Recall that an admissible version of an O-tree representation is LB-compact. As illustrated, transformer 108 effectuates the generation by interatively invoking TTG generator 110 and GTT generator 112, until the LB-compact result is achieved. At 502, transformer 108 invokes TTG generator 110 to generate an orthogonal constraint graph for the O-tree representation. At 504, transformer 108 invokes GTT generator 112 to re-generate the O-tree representation, in view of the generated orthogonal constraint graph. At 506, transformer 108 determines if the re-generated O-tree representation is LB-compact If the re-generated O-tree representation is LB-compact, the process terminates, otherwise the process continues at 502 again.

Figure 6A:
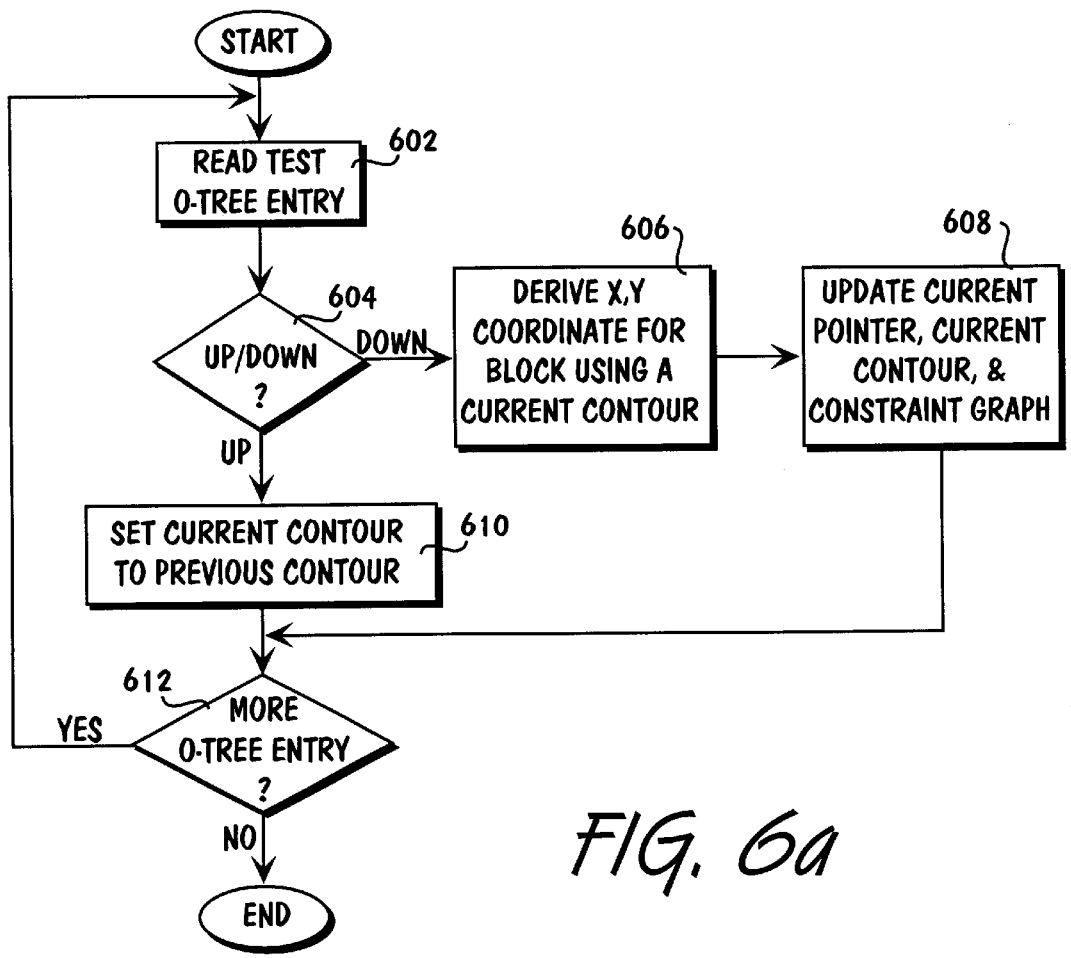

Referring now to FIG. 6a, wherein a block diagram illustrating the operation flow of GTT generator 110 of FIG. 1a in accordance with one embodiment is shown. As described earlier, GTT generator 110 is invoked to generate the orthogonal constraint graph for an O-tree representation. Recall that the orthogonal constraint graph consists of orthogonal edges, i.e. vertical or horizontal edges representing geometry constraints. A geometry constraint exists if a line can be drawn between two design blocks without passing through other design blocks. As shown, at 602, GTT generator 110 reads the next O-tree entry. If the entry denotes downward traversal, 604, the process continues at 606 and 608, else at 610. At 606, GTT generator 110 derives the x and y coordinates for the design block using the earlier described current contour, denoting the profile of the top edges of the reference top design blocks for the candidate insertion point (see FIG. 12). At 608, GTT generator 110 updates the current contour, its pointer, and the constraint graph set (refer to earlier description for constraint graph). After 608, the process continues at 612.

Back at 604, if the entry denotes upward traversal instead, at 610, GTT generator 110 sets the current contour pointer to point to the previous contour instead. In any event, at 612, GTT generator 110 determines if all O-tree entries have been analyzed. If not, the process continues at operation 602 again, else the process terminates.

Figure 6B:
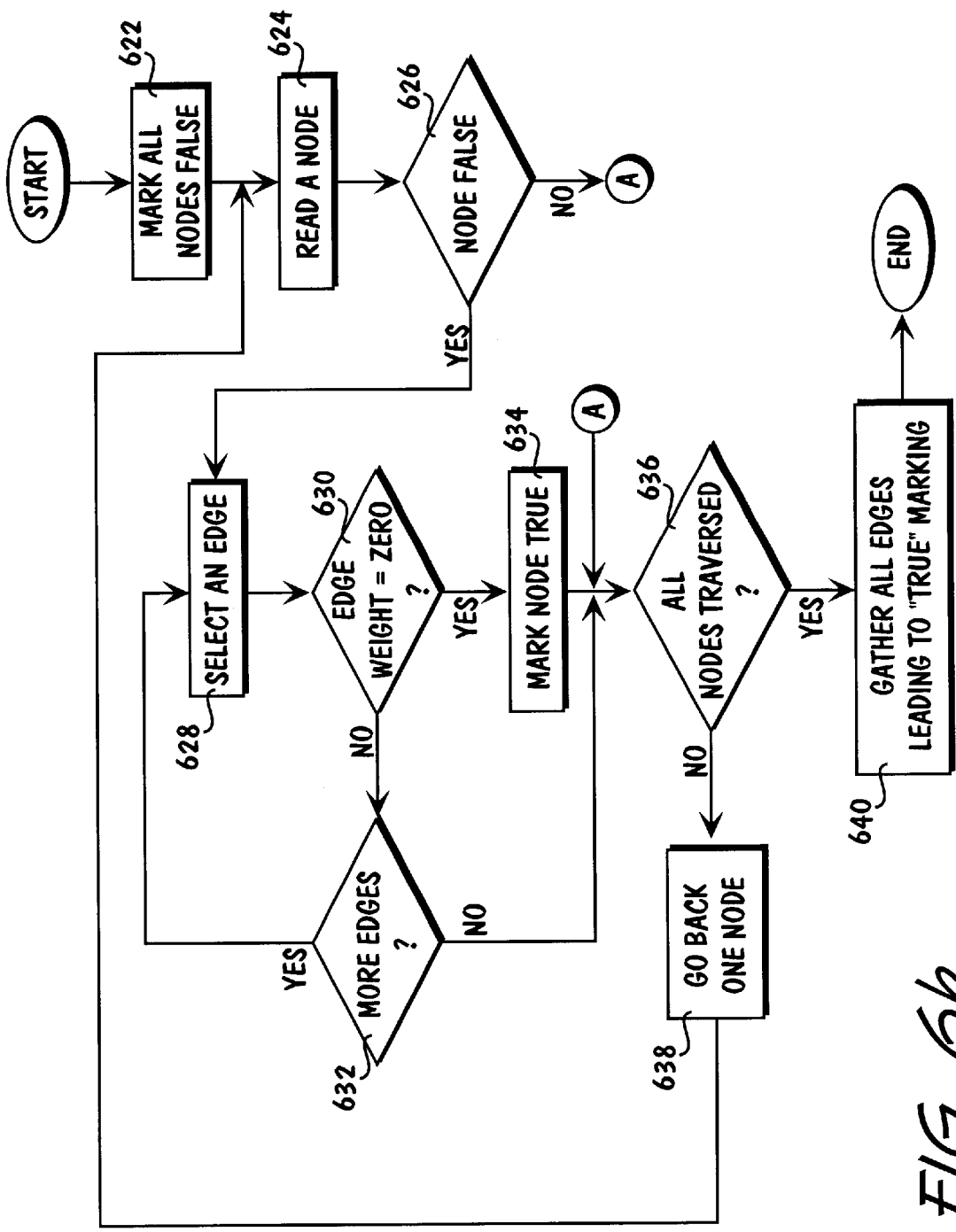

Referring now to FIG. 6b, wherein a block diagram illustrating the operation flow of TTG generator 112 in accordance with one embodiment is shown. As described earlier, TTG generator 112 is invoked to re-generate the O-tree representation in view of the generated orthogonal constraint graph. As shown, at 622, TTG generator 112 mark all nodes in the reduced version of the O-tree (augmented with the candidate insertion points) "false". At 624, TTG generator 112 reads the next node entry. At 626, TTG generator 112 determines if the node is marked "false". If the node is marked "false", the process continues at 628, else at 636.

At 628, TTG generator 112 selects an edge in the constraint graph to determine if the weight of the edge is zero, 630 (weight equals zero if two blocks are adjacent to each other). If the weight equals zero, the process continues at 632, else at 634. At 632, TTG generator 112 determines if there are more edges to analyzed. If not all edges have been analyzed, the process continues at operation 628 as described earlier, else at 636. Back at 630, if it was determined that the weight of the edge is zero, at 634, the node is mark as "true".

In any event, at 636, TTG generator 112 determines if all nodes have been analyzed. If not all nodes have been analyzed, the process continues at 624 as described earlier, else the process continues at 640, where TTG generator 112 gathers up all nodes that have been re-marked as "true" to output the new O-tree representation.

Figure 4B:
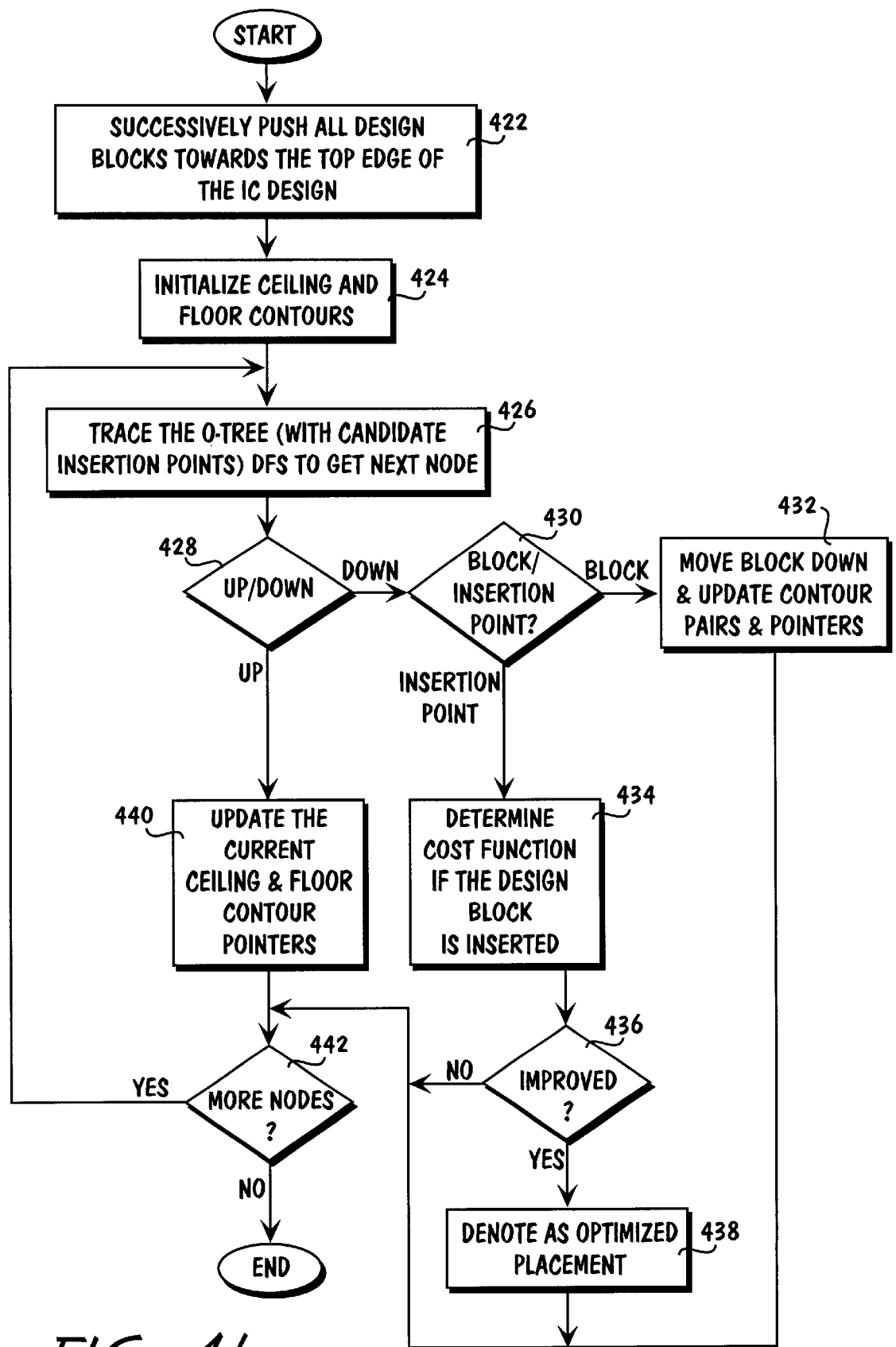

Referring now back to FIG. 4b, wherein a block diagram illustrating operation 304 of FIG. 3 in further detail for the embodiment of FIG. 1b is shown. In the earlier described embodiment (i.e. FIG. 4a), for each removed design block, all candidate insertion points are analyzed. For an IC design with n design blocks, 2n+1 candidate insertion points exist. Thus, for each candidate insertion point, it takes O(n) operations to find the corresponding floorplan and evaluate the cost function. Thus, for the earlier described embodiment, it takes O(n(2n+1)) operations for optimizer 104 to analyze all possible candidate insertion points for a removed design block. In this embodiment, a more streamlined approach that reduces the number of operations to O(n) by integrally performing the placement generation and candidate insertion point consideration.

As shown, at 422, optimizer 104' first successively pushes all design blocks towards the top edge of the IC design. At 424, optimizer 104' invokes contour tracker 114 to initialize a ceiling contour and a floor contour. Recall from earlier description that the ceiling contour is the profile of the bottom edges of the design blocks pushed towards the top edge of the IC design, whereas the floor contour is the profile of the top edges of the design blocks pushed towards the bottom edge of the IC design. At this time, the floor contour is simply the bottom edge of the IC design (FIG. 13*a*). Contour tracker 114 also correspondingly initialize a pair of corresponding pointers pointing to the appropriate bottom and top edges of the design blocks of the top-ward and bottom-ward pushed design blocks respectively. At this time, the ceiling contour pointer points to the lowest leftmost top-ward pushed design block, whereas the floor contour pointer simply points to the bottom edge of the IC design.

At 426, optimizer 104' trace the reduced version of the O-tree representation (augmented with the candidate insertion points) in a depth first manner to obtain a next node for analysis. At 428, optimizer 104' determines if the node denotes upward or downward traversal. If it is downward traversal, at 430, optimizer 104' further determines if the node is a design block or an insertion point. If it is a design block, at 432, optimizer 104' moves the design block down towards the bottom edge of the IC design. Optimizer 104' further invokes contour tracker 114 to update the ceiling and contour pair and their corresponding pointers. The process then continues at 440.

Back at 430, if the node is an insertion point instead, at 434, optimizer 104' determine the cost function as if the design block has been reinserted at the candidate insertion point. At 436, optimizer 104' determines if there are any improvement to the cost function. If improved, the placement is denoted as the optimized placement, 438, else the process continues at 442.

Back at 428, if the traversal is going up, optimizer 104' updates the ceiling and floor contours as well as their corresponding pointers accordingly. Finally, at 442, optimizer 104' determines if all nodes have been analyzed. If not all nodes have been analyzed, the process continues at 406, else the process terminates.

Experience has shown under the embodiment of FIG. 4*b*, the computational complexity is reduced (improved) by as much as one order of magnitude of the number of blocks (O(n)) over that of the embodiment of FIG. 4*a* (which takes in the O(n(2n+1)) number of operations), where n equals the number of design blocks of the IC design.

Figure 7:
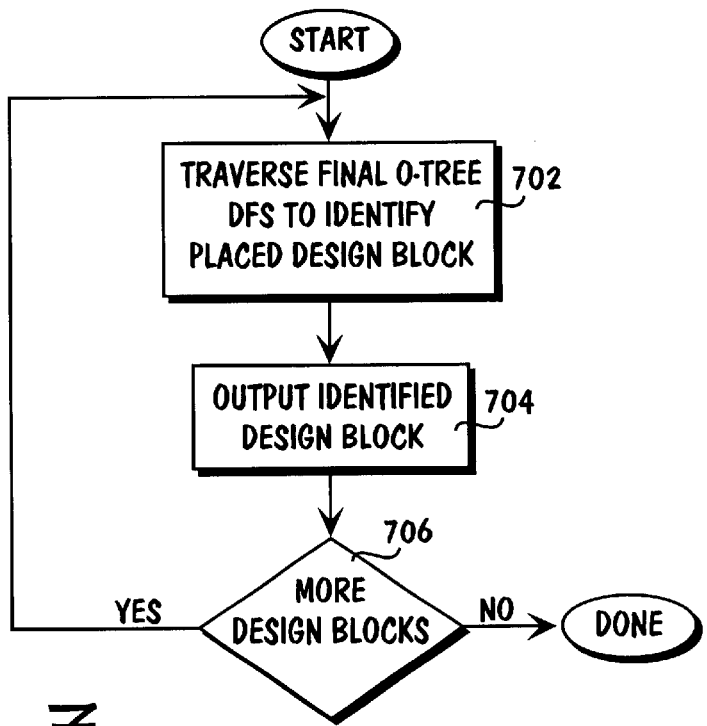
FIG. 7 illustrates the operation flow of the output generator of FIGS. 1a–1b, in accordance with one embodiment.

Referring now to FIG. 7, wherein a block diagram illustrating the operation flow of output generator 106 in accordance with one embodiment is shown. As described earlier, output generator 106 takes the final O-tree representation representing the optimized placement permutation, and outputs the floorplan. At 702, output generator 106 traverses the final O-tree representation in a depth-first manner to identify the next placed design block to be output. At 704, the identified design block is output. At 706, output generator 106 determines if all design blocks have been output. If all design blocks have been output, the process terminates, otherwise, the process continues at step 702 again.

Figure 8:
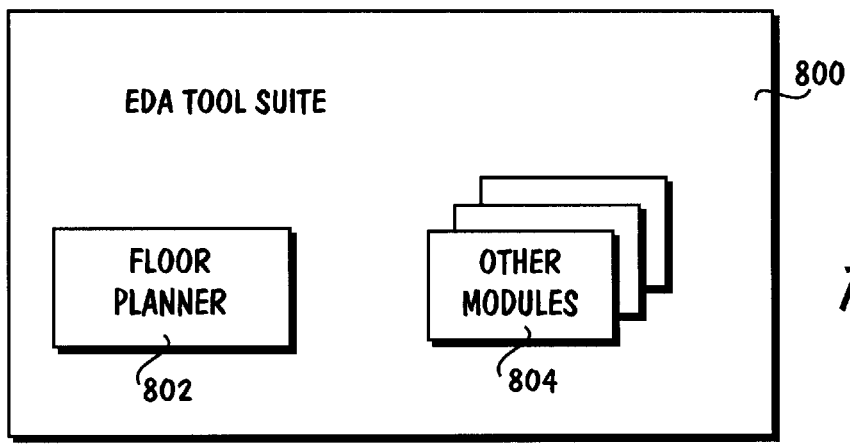
FIG. 8 illustrates an example EDA tool incorporated with the floorplanner of the present invention, in accordance with one embodiment.

Referring now to FIG. 8, wherein an EDA tool incorporated with the floorplanner of the present invention in accordance with one embodiment is shown. As illustrated, EDA tool suite 800 includes floorplanner 802 incorporated with the teachings of the present invention as described earlier with references to FIGS. 1–7 and 10*a*–10*d*. Additionally, EDA tool suite 800 includes other tool modules 804. Examples of these other tool modules 802 include but not limited to synthesis module, layout verification module and so forth.

Figure 9:
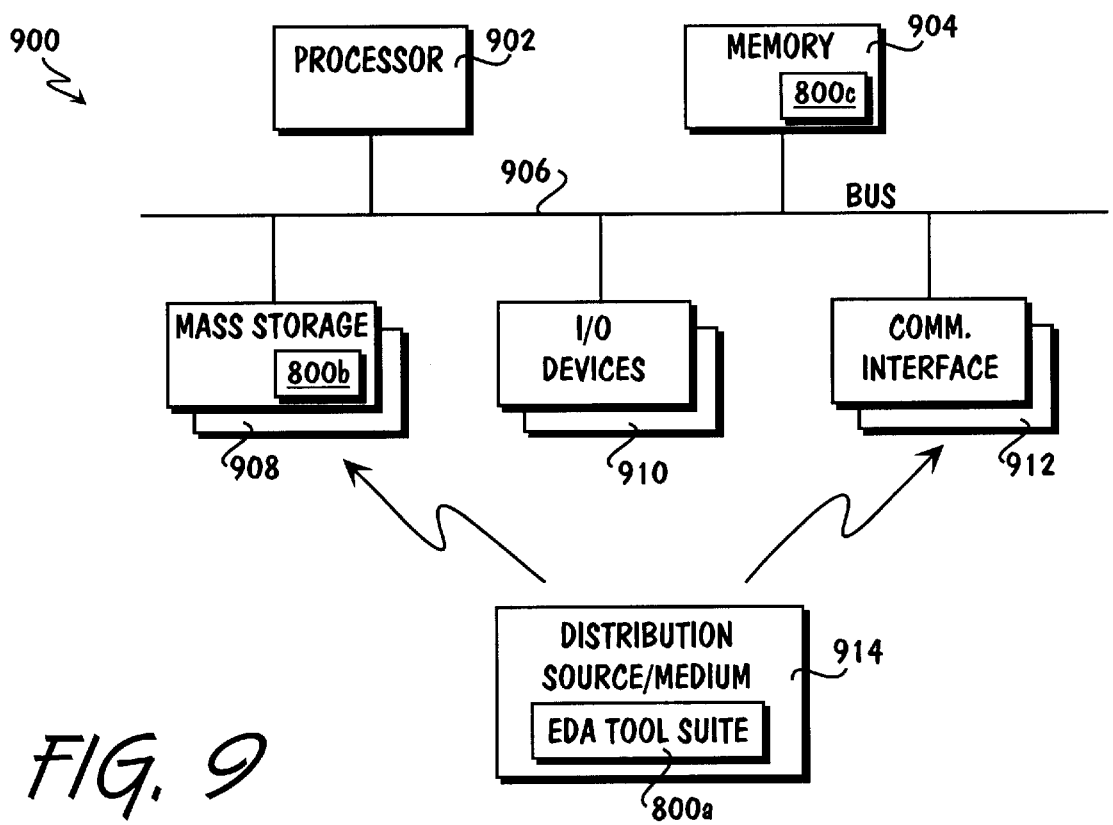
FIG. 9 illustrates an example computer system suitable to be programmed with the programming instructions implementing the EDA tool of FIG. 8.
Figure 10A:
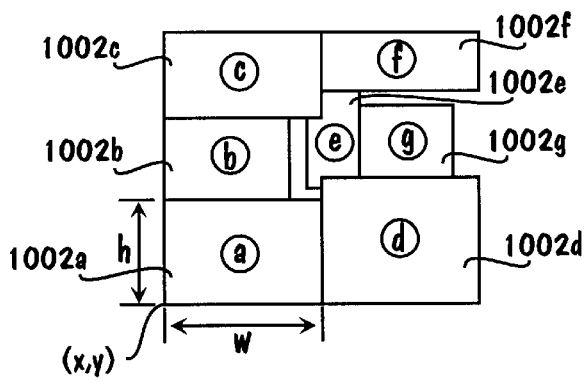
FIGS. 10a–10d illustrate an example IC design with multiple design blocks, the concept of O-tree representation, and its encoding.
Figure 10B:
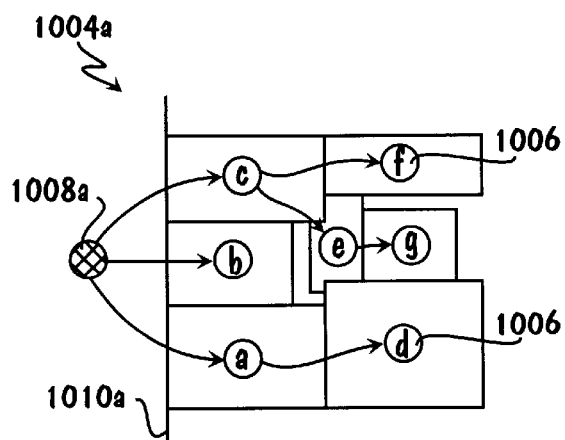
Figure 10C:
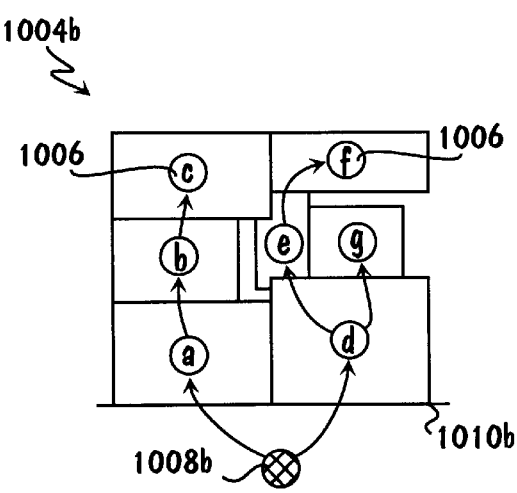
Figure 10D:
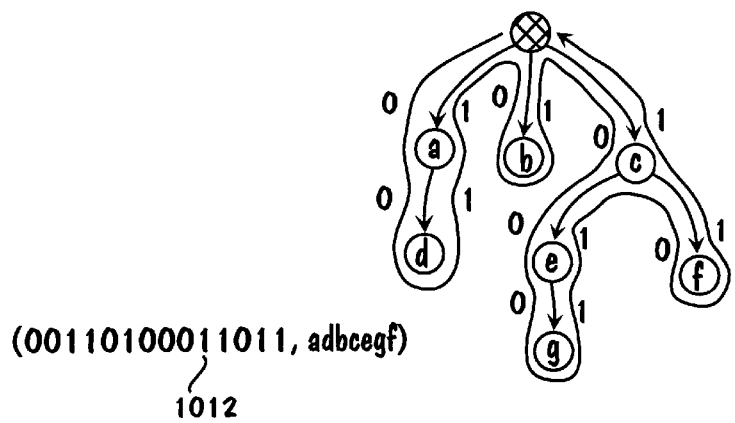

FIG. 9 illustrates one embodiment of a computer system suitable for use to practice the present invention. As shown, computer system 900 includes processor 902 and memory 904 coupled to each other via system bus 906. Coupled to system bus 906 are non-volatile mass storage 908, such as hard disks, floppy disk, and so forth, input/output devices 910, such as keyboard, displays, and so forth, and communication interfaces 912, such as modem, LAN interfaces, and so forth. Each of these elements perform its conventional functions known in the art. In particular, system memory 904 and non-volatile mass storage 908 are employed to store a working copy and a permanent copy of the programming instructions implementing the above described teachings of the present invention. System memory 904 and non-volatile mass storage 906 may also be employed to store the IC designs. The permanent copy of the programming instructions to practice the present invention may be loaded into non-volatile mass storage 908 in the factory, or in the field, using distribution source/medium 914 and optionally, communication interface 912. Examples of distribution medium 914 include recordable medium such as tapes, CDROM, DVD, and so forth. In one embodiment, the programming instructions are part of a collection of programming instructions implementing EDA tool 800 of FIG. 8. The constitution of elements 902–914 are well known, and accordingly will not be further described.

In general, those skilled in the art will recognize that the present invention is not limited to the embodiments described. Instead, the present invention can be practiced with modifications and alterations within the spirit and scope of the appended claims. The description is thus to be regarded as illustrative, instead of restrictive on the present invention.

Thus, a method and an apparatus for generating an optimized floorplan for an IC design with multiple design blocks have been described.

What is claimed is:

1. An improved computer implemented optimizer method for automatically generating an optimized floorplan for a plurality of design blocks of an integrated circuit (IC) design, where a placement of the design blocks is represented by an O-tree representation, the improved method comprising operations of:

using ceiling and floor contours and corresponding pointers to assist in integrally generating and evaluating alternate placements for the design blocks, while systematically perturbing the O-tree representation to seek an alternate O-tree representation that yields an optimized floorplan in accordance with a cost function; and generating the optimized floorplan in accordance with result of said evaluating.

2. The method of claim 1, wherein said using operation comprises using ceiling and floor contours and corresponding pointers to assist in determining if an alternate placement position exists for a removed design block, while systematically traversing a reduced version of an O-tree representation without the removed design block, but augmented with candidate insertion points.

3. The method of claim 2, wherein said using operation comprises using ceiling and floor contours and corresponding pointers to integrally generate a floorplan while considering re-inserting the removed design block at various candidate insertion points.

4. The method of claim 3, wherein said integral generation of a floorplan while considering re-inserting the removed design block at various candidate insertion points comprises moving all remaining design blocks towards a top edge of the IC design, and establishing a ceiling contour and a floor contour as well as corresponding pointers for the ceiling and floor contours.

5. The method of claim 4, wherein said integral generation of a floorplan while considering re-inserting the removed design block at various candidate insertion points further comprises relocating one of said all remaining design blocks which were previously moved towards a top edge, towards a bottom edge of the IC design, and updating said ceiling and floor contours and the corresponding pointers.

6. The method of claim 5, wherein said integral generation of a floorplan while considering re-inserting the removed design block at various candidate insertion points further comprises iteratively repeating said relocating and updating for each of said all remaining design blocks which were previously moved towards a top edge, one remaining design block at a time.

7. The method of claim 1, wherein said using operation further comprises evaluating the cost function in view of the floorplan generated using ceiling and floor contours and corresponding pointers.

8. An article of manufacture comprising:
   a recordable medium having stored therein a plurality of programming instructions to be executed by a processor, wherein when executed, causes the method as set forth in claim 1 to be performed.

9. The article of claim 8, wherein the programming instructions, when executed, further causes additional operations set forth in claim 2 to be performed.

10. The article of claim 9, wherein the programming instructions, when executed, further causes additional operations set forth in claim 3 to be performed.

11. The article of claim 10, wherein the programming instructions, when executed, further causes additional operations set forth in claim 4 to be performed.

12. The article of claim 11, wherein the programming instructions, when executed, further causes additional operations set forth in claim 5 to be performed.

13. A computer system comprising:
   an improved optimizer that uses ceiling and floor contours and corresponding pointers to assist in integrally generating and evaluating alternate placements for design blocks of an IC design, while systematically perturb an O-tree representation of the IC design to seek an alternate O-tree representation that yields an optimized floorplan in accordance with a cost function; and
   an output generator operatively coupled to the improved optimizer to output an optimized floorplan for the IC design in accordance with result of said evaluating.

14. The computer system of claim 13, wherein the improved optimizer uses ceiling and floor contours and corresponding pointers to assist in determining if an alternate position exists for a removed design block, while systematically traversing a reduced version of an O-tree representation without the removed design block, but augmented with candidate insertion points.

15. The computer system of claim 14, wherein said improved optimizer integrally generates a floorplan and considers re-inserting the removed design block into various candidate reinsertion points.

16. The computer system of claim 15, wherein said improved optimizer moves all remaining design blocks towards a top edge of the IC design, and establishes a ceiling contour and a floor contour and corresponding pointers for the contours.

17. The computer system of claim 16, wherein said improved optimizer relocates one of said all remaining design blocks which were previously moved towards a top edge, towards a bottom edge of the IC design, and updates the ceiling and floor contours and the corresponding pointers.

18. The computer system of claim 17, wherein said improved optimizer iteratively repeats said relocation and update for each of said all remaining design blocks which were previously moved towards a top edge, one remaining design block at a time.

19. The computer system of claim 13, wherein the improved optimizer further evaluates the cost function in view of the floorplan generated using the ceiling and floor contours and corresponding pointers.

* * * * *

UNITED STATES PATENT AND TRADEMARK OFFICE
CERTIFICATE OF CORRECTION

PATENT NO. : 6,282,694 B1  
DATED : August 28, 2001  
INVENTOR(S) : Chung-Kuan Cheng and Pei-Ning Guo It is certified that error appears in the above-identified patent and that said Letters Patent is hereby corrected as shown below:

Column 5,
Line 5, "10b" should read -- 1010b --.

Signed and Sealed this

Fifteenth Day of October, 2002

Attest:

JAMES E. ROGAN
Attesting Officer         Director of the United States Patent and Trademark Office